United States Patent [19]
Peng

[11] Patent Number: 5,851,886
[45] Date of Patent: Dec. 22, 1998

[54] METHOD OF LARGE ANGLE TILT IMPLANT OF CHANNEL REGION

[75] Inventor: Jack Zezhong Peng, San Jose, Calif.

[73] Assignee: Advanced MIcro Devices, Inc., Sunnyvale, Calif.

[21] Appl. No.: 546,738

[22] Filed: Oct. 23, 1995

[51] Int. Cl.⁶ .............................................. H01L 21/336
[52] U.S. Cl. .................. 438/289; 438/290; 438/291; 438/301; 438/302
[58] Field of Search ..................... 437/35, 44, 41; 438/302, 301, 289, 290, 291

[56] References Cited

U.S. PATENT DOCUMENTS

| | | | |
|---|---|---|---|
| 4,889,820 | 12/1989 | Mori | 437/35 |
| 5,258,319 | 11/1993 | Inuishi et al. | 437/35 |
| 5,366,915 | 11/1994 | Kodama | 437/35 |
| 5,376,566 | 12/1994 | Gonzalez | 437/35 |
| 5,478,763 | 12/1995 | Hong | 437/35 |
| 5,518,941 | 5/1996 | Lin et al. | 437/35 |
| 5,518,942 | 5/1996 | Shrivastava | 437/35 |
| 5,578,509 | 11/1996 | Fujita | 437/35 |
| 5,578,510 | 11/1996 | Tani | 437/35 |
| 5,593,907 | 1/1997 | Anjum et al. | 437/35 |

Primary Examiner—John Niebling
Assistant Examiner—Lynne A. Gurley
Attorney, Agent, or Firm—Fliesler Dubb Meyer & Lovejoy LLP

[57] ABSTRACT

A channel region formation process in field effect transistors directed toward reducing threshold voltage sensitivity to variations in gate length resulting from manufacturing techniques. A polysilicon gate is formed over the substrate and a channel region is subsequently implanted at a large angle measured from perpendicular to the substrate. Large angle implantation results in a non-uniform doping concentration in the channel region, improving threshold voltage sensitivity. Improvement can also be seen in other parameters, including source-drain current, substrate current, leakage current, magnification factor, and hot electron channel injection efficiency.

14 Claims, 8 Drawing Sheets

METHOD OF LARGE ANGLE TILT IMPLANT OF CHANNEL REGION

BACKGROUND OF THE INVENTION

1. Field of Invention

The invention relates to field effect transistor channel region formation, and more particularly to ion implantation of the channel region.

2. Description of Related Art

Generally, field effect transistors have a source, a drain, and a gate as shown in FIG. 1 During operation, a voltage difference is applied between the source and drain regions. However, no current can flow between the regions until the channel becomes conductive. The channel becomes conductive when an appropriate gate to source voltage difference is applied to cause a conductive channel to form between the source and the drain. The minimum gate to source voltage which causes the channel region to be conductive is known as its threshold voltage ($V_t$).

Typically, $V_t$ in a MOS transistor is close to 0 volts. However, threshold voltage tends to be sensitive to the dopant concentration in the wafer surface under the gate. Thus, ion implantation is often used to vary and control (typically to increase) the $V_t$ required to form a conductive channel.

Conventionally, as shown in FIG. 2A, the channel region is implanted with ions by exposing the channel region to a doping material approximately perpendicular to the substrate surface (±7°) prior to gate formation. Once implanted, the doping concentration throughout the channel region is uniform from the source to the drain. That is, no area in the channel region has a density of ions per unit area significantly larger or smaller than any other area of the channel. Such perpendicular doping will hereafter be referred to as "uniform channel implants" or "UCI" doping. After the channel region is implanted, the gate is then formed, as shown in FIG. 2B.

After the gate is formed, source and drain regions are formed, resulting in the structure as shown in FIG. 1. The gate acts as a mask to locate the source and drain in a self-aligned manner, and therefore, to a large extent, the gate length ($L_g$) determines channel length which is the source-drain separation. Channel length is a factor in addition to channel doping concentration that affects $V_t$. As channel length decreases, so does $V_t$. Because channel length is defined by gate length $L_g$, small variations in $L_g$ can significantly affect $V_t$. For instance, a typical gate length is defined at 0.35 microns. However, because of limitations of manufacturing techniques, gate length may actually vary by as much as ±0.05 microns. Such variation leads to significant changes in $V_t$, as shown in FIG. 3, which in turn influences many other parameters associated with transistors, including source-drain current ($I_{ds}$), substrate current ($I_{sub}$), and leakage current ($I_{doff}$), as well as others. Thus, a better gate length tolerance is desired.

SUMMARY OF THE INVENTION

The present invention, roughly described, is directed to formation of the channel region in field effect transistors. It is desirable to decrease threshold voltage ($V_t$) sensitivity to variations in gate length ($L_g$) caused by manufacturing techniques.

To reduce $V_t$ sensitivity, the process according to the invention, is initiated by the formation of a polysilicon gate over the substrate. The channel region is then formed under the substrate by implanting ions at a large angle from perpendicular to the substrate. Source and drain regions are subsequently formed using conventional perpendicular implant techniques.

As a result of the large angle tilt implant (LATI) of the channel regions the ion concentration in the channel region is not uniform under the gate, a higher concentration of ions being located near the edge of the gate on the side of the gate where the implant took place. Non-uniform concentration, in turn, reduces the sensitivity of $V_t$ to variations in $L_g$ and also reduces variations in $I_{ds}$, $I_{sub}$, and $I_{doff}$.

BRIEF DESCRIPTION OF THE DRAWINGS

The invention will be described with respect to particular embodiments thereof, and reference will be made to the drawings, in which.

DETAILED DESCRIPTION OF INVENTION

Because small variations in gate length will have a large and significant influence on the threshold voltage as well as many other parameters including source-drain current ($I_{ds}$), substrate current ($I_{sub}$), and leakage current ($I_{doff}$), an improved gate length dimension tolerance is desired. In accordance with the invention, to improve the gate length dimension tolerance, rather than defining the channel before the gate is formed, the channel is defined subsequent to gate formation. In order to implant the channel region subsequent to gate formation, implantation must occur at a large angle to the substrate from perpendicular to the substrate surface. If the angle of implantation occurs from one side of the gate only, e.g., the source side, use of a large angle implant results in doping concentrations in the channel region near the source to be much higher than those near the drain. Because doping concentration is varied from the source to the drain, rather than being uniform, variations in gate length have a less significant effect on threshold voltage as well as other parameters.

Figure 4A:
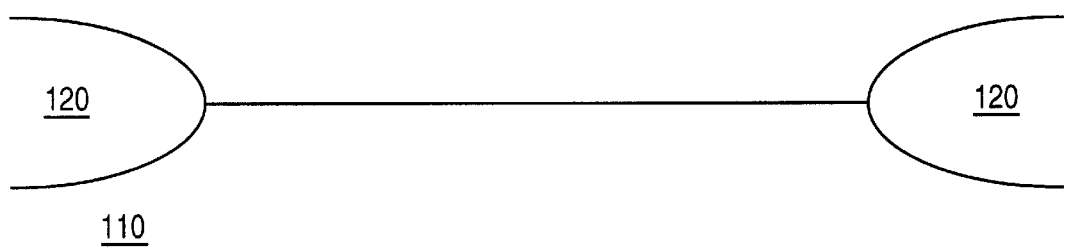
FIG. 4A is a cross-sectional view of a substrate with formed field oxide regions.
Figure 4B:
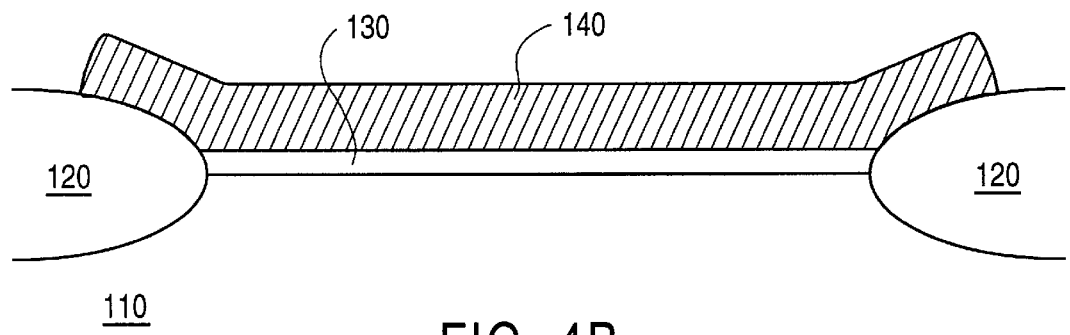
FIG. 4B is a cross-sectional view of a substrate having overlying gate oxide and polysilicon layers.
Figure 4C:
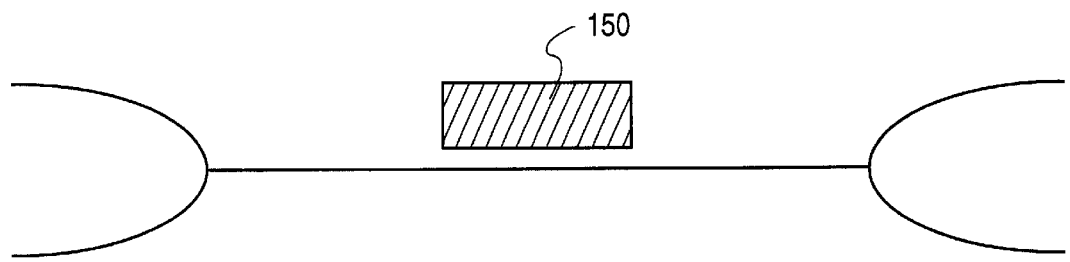
FIG. 4C is a cross-sectional view of a substrate having a polysilicon gate formed over the substrate.

More specifically, referring to FIG. 4A, a silicon substrate 110 is provided upon which is grown field oxide regions 120, used for isolating active devices from one another. In FIG. 4B, gate oxide region 130 is grown upon substrate 110 and is typically grown to a thickness of approximately 70 Å to 500 Å. This layer is generally provided by heating the substrate and exposing it to a dry ambient oxidant, although a wet oxide is also suitable, at a temperature in a range of 800° to 1000° C. for a given period of time depending upon the thickness of the layer desired. A layer of polysilicon 140 is then deposited using, for example, conventional chemical vapor deposition (CVD) techniques to a thickness in a range of about 2500 Å to 3000 Å. Polysilicon layer 140 is then etched to form polysilicon gate 150 shown in FIG. 4C.

Figure 4D:
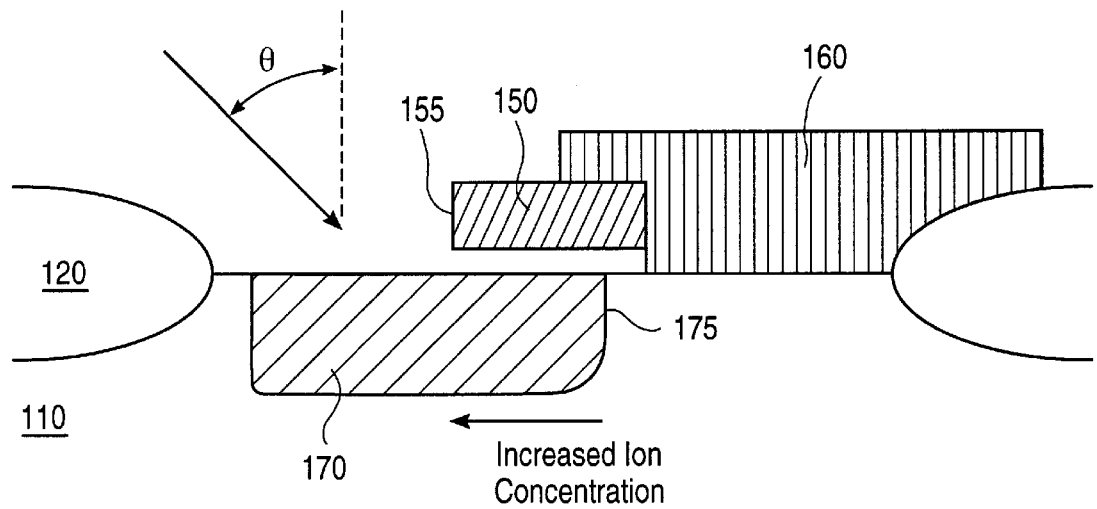
FIG. 4D is a cross-sectional view of a partially formed device utilizing a process in accordance with the present invention.

In one embodiment of the invention, a photoresist layer of approximately 0.5 microns (5000 Å) is then applied over the substrate surface 110 and over polysilicon gate 150. A masking step is performed to expose portions of the photoresist layer to ultraviolet (UV) light, and, depending on the type of photoresist (a positively acting resist or a negative acting resist) the exposed or unexposed portions of the photoresist layer are removed. The result is resist mask 160, shown in FIG. 4D. Substrate 110 is then implanted with ions at an angle θ of approximately 45° to 600° from perpendicular to substrate 110. If p-type channel doping is desired, boron ions may be implanted in one embodiment, and if n-type channel doping is desired, phosphorous ions may be used in an alternative embodiment of the invention. Typically, during implantation, the wafer is rotated in 90°0 intervals in a plane. However, because resist mask 160 has been formed, ions will be able to enter the substrate only from one side of the gate 150. The result of this large angle tilt implantation (LATI) is doped region 170 which extends under the gate 150. The ion concentration of region 170 increases as the lateral distance moves from a lateral location under the gate 175 toward gate edge 155 as shown in FIG. 4D. Region 170 forms the channel region of the device.

Figure 4E:
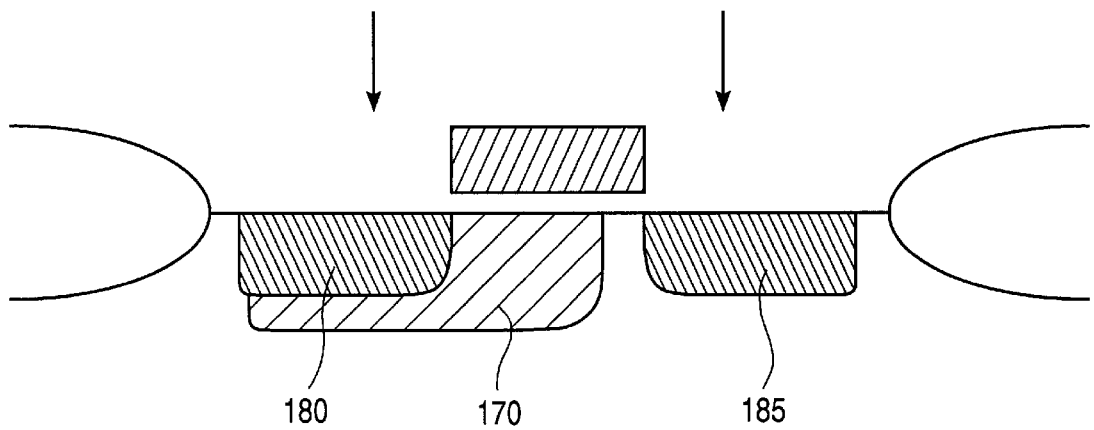
FIG. 4E is a cross-sectional view of a partially formed device using a channel and lightly doped source and drain regions formed in accordance with the present invention.
Figure 4F:
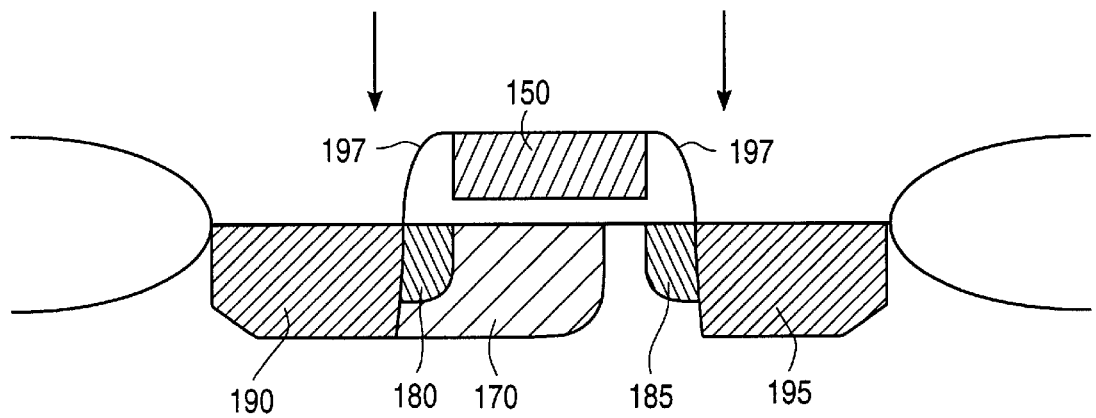
FIG. 4F is a cross-sectional view of a device formed in accordance with one embodiment of the present invention.

Subsequent to channel region 170 formation, source 190 and drain 195 regions are formed. As shown in FIGS. 4E and 4F, these regions are implanted after resist mask 160 is removed, at an angle perpendicular to substrate 110. In one embodiment shown in FIG. 4E, lightly doped source and drain regions (LDD regions), 180 and 185, are formed first. Subsequently, spacers 197 are formed, typically by depositing a spacer forming layer (not shown) over the entire wafer construct and then etching anisotropically. Source region 190 and drain region 195 are subsequently formed by exposing the substrate surface to dopant material, which is arsenic in one embodiment, at an angle perpendicular to the substrate 110 surface.

Figure 5A:
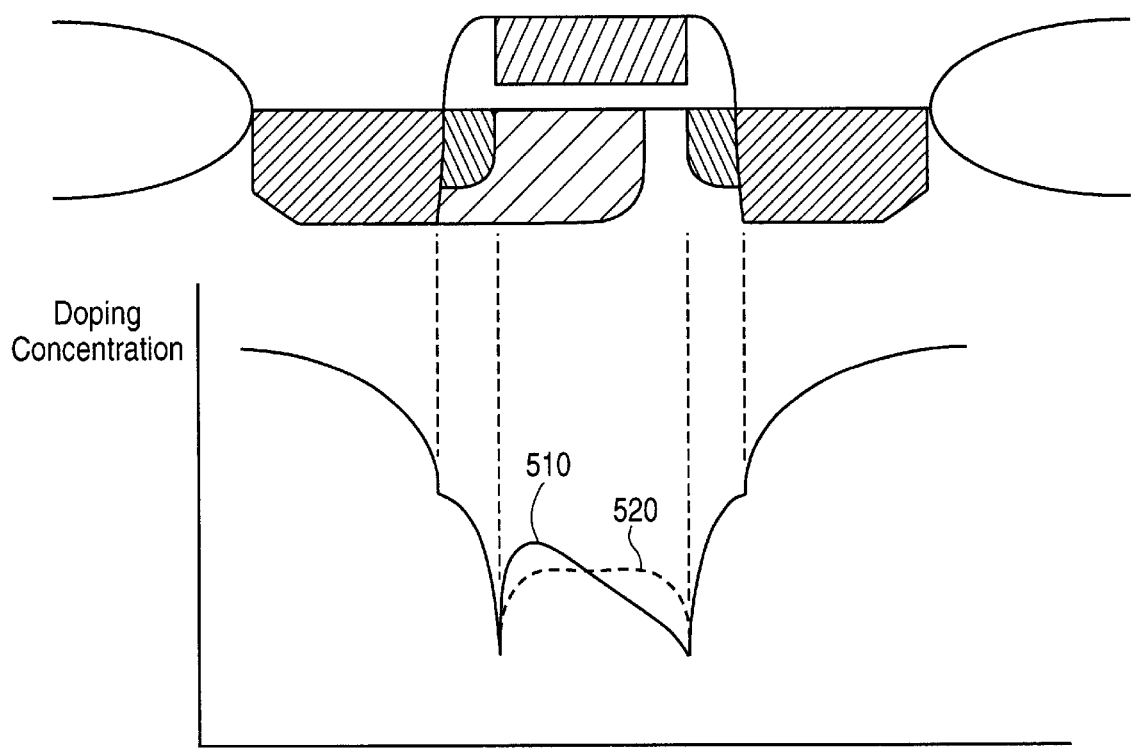
FIG. 5A is a cross-sectional view of a device formed in accordance with the present invention and a plot of corresponding doping concentrations.

As shown in FIG. 5A, the above-described process results in doping concentrations in the channel area that are not uniform throughout the channel region. Curve 510 shows the doping concentrations versus lateral distance for a device whose channel region is implanted using the LATI technique in accordance with the invention. Curve 520 represents the doping concentrations of a device whose channel region is implanted prior to gate formation using conventional UCI methods.

Figure 1:
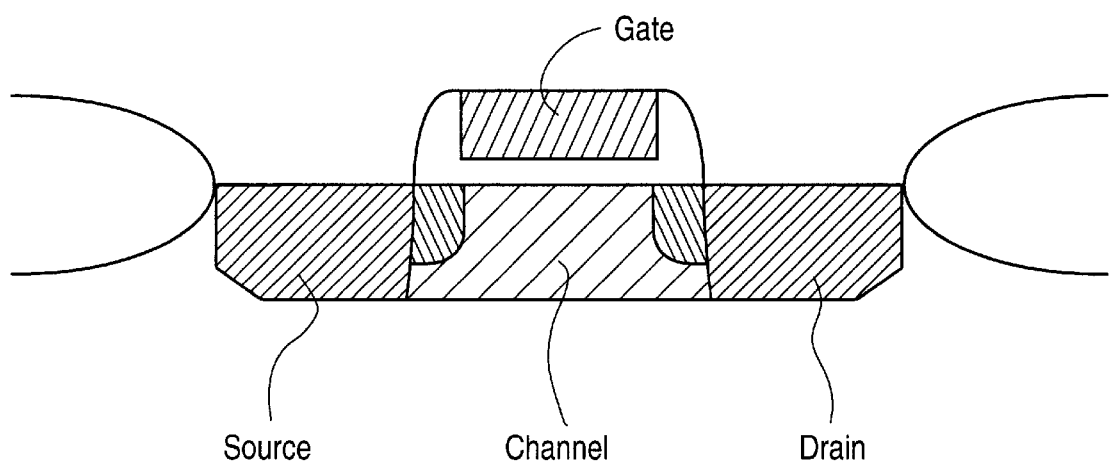
FIG. 1 is a cross-sectional view of a conventional transistor.
Figure 2A:
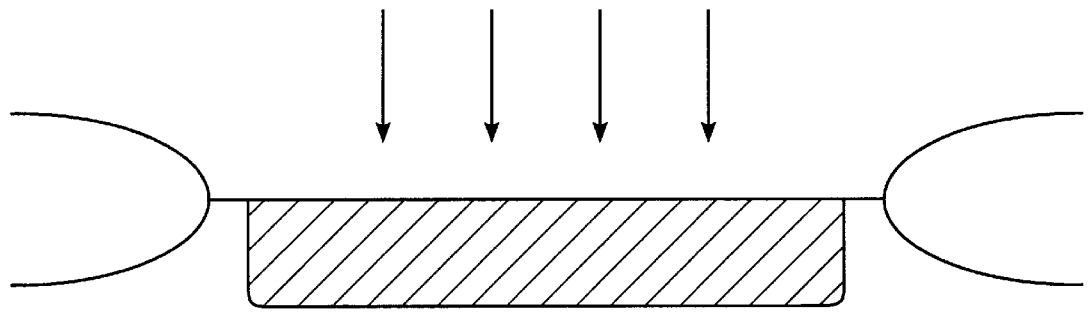
FIG. 2A is a cross-sectional view of a partially formed transistor device formed using conventional channel implantation methods.
Figure 2B:
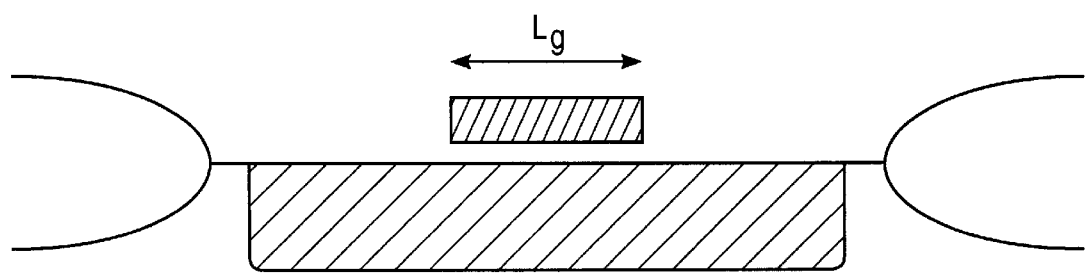
FIG. 2B is a cross-sectional view of a partially formed transistor device having a channel region formed by conventional methods and a gate formed over the substrate.
Figure 3:
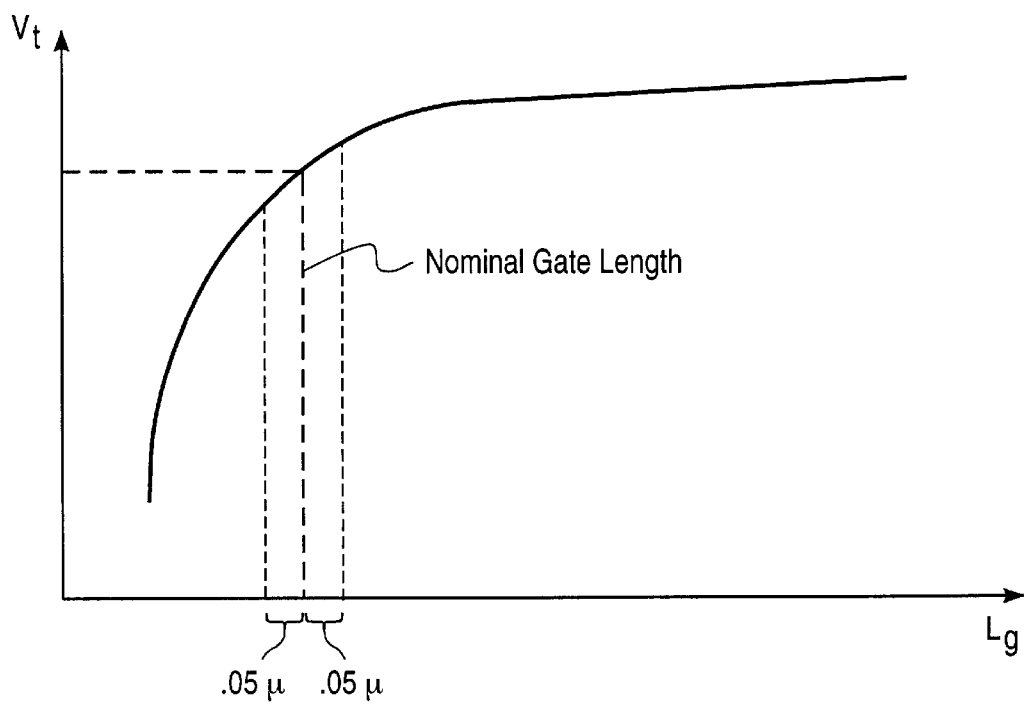
FIG. 3 is a rough plot of gate length versus threshold voltage for conventional channel implantation methods.
Figure 5B:
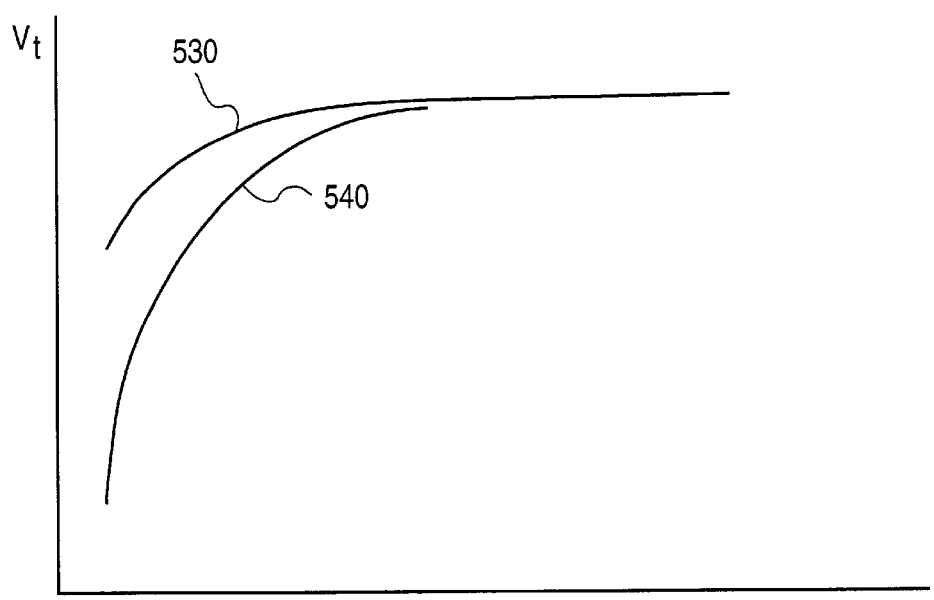
FIG. 5B is a rough plot of gate length to threshold voltage for a device formed in accordance with the present invention.

Further, as a result of the LATI techniques in accordance with the invention and as shown by curve 530 in FIG. 5B, as gate length varies, threshold voltage variation is reduced from that experienced by devices formed utilizing conventional UCI methods as shown by curve 540 and FIG. 3.

In addition, improvement can be seen in the following parameters:

1. $I_{ds}$ is higher in a LATI device than in a UCI device due to a lower electric field peak and a more uniform electric field in the LATI device;
2. $I_{sub}$ is reduced in a LATI device from UCI devices because of the lower peak electric field resulting in the LATI device, causing fewer hot electrons, resulting in a longer device life;
3. Magnification factor (M-factor) or $I_{sub}/I_{ds}$ (measures of the amount of channel current to generate one hot electron or hot hole) is reduced by an order of magnitude in a LATI device from UCI devices;
4. $I_{doff}$ (leakage current) is reduced in a LATI device by an order of magnitude from UCI devices;
5. Hot electron channel injection efficiency is reduced in a LATI device from UCI device by two orders of magnitude, resulting in a longer device life;
6. Source-junction capacitance is reduced in a LATI device from a UCI device, resulting in an increased device speed.

Figure 6A:
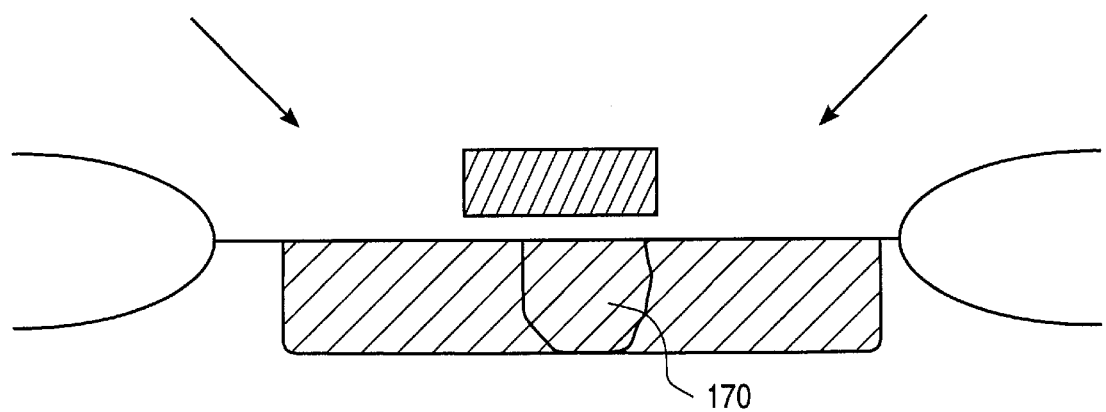
FIG. 6A shows channel region formed in accordance with one embodiment of the present invention.
Figure 6B:
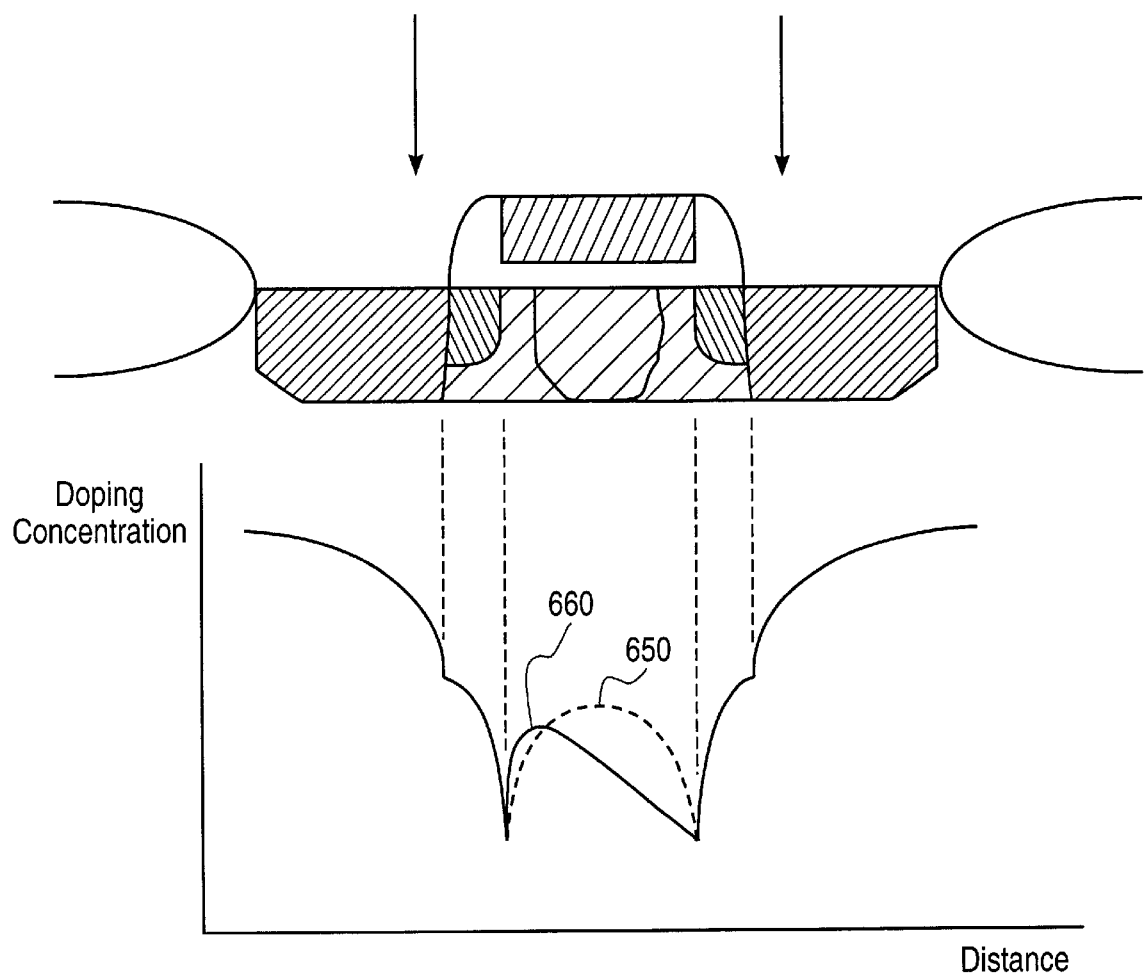
FIG. 6B is a cross-sectional view of a device formed in accordance with one embodiment of the present invention and a corresponding plot of lateral distance to doping concentration.

In a second embodiment of the invention, shown in FIG. 6A, the LATI technique is used without masking. The method according to this embodiment of the invention is similar to the embodiment of the invention utilizing masking, and described above with reference to FIGS. 4A–F, except that a photoresist mask 160 (shown in FIG. 4D) is not formed. Thus, when the substrate is rotated during implantation, doping of the channel region will occur at angles of ±(45–60)° from perpendicular to the substrate surface, and will result in doping concentrations in the channel region peaking near a central location under the gate. As shown in FIG. 6B, curve 650 shows the doping concentrations resulting from LATI techniques not utilizing a mask as compared to the results of the embodiment using a mask, curve 660. Improvements result from non-masked angled doping over UCI, but typically do not show as marked an improvement as shown in embodiments using masked LATI. However, non-masked LATI is easier for manufacturing because no photoresist mask is required.

Figure 7:
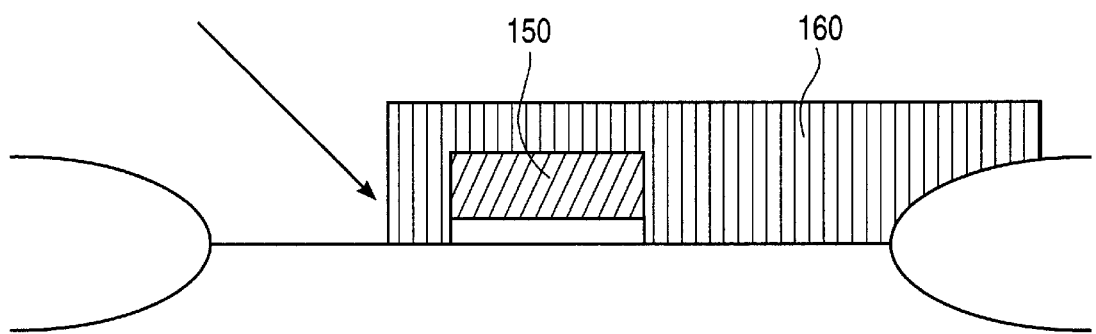
FIG. 7 is a cross-sectional view of a misaligned masking layer.

In single-sided LATI (or source-side LATI) mask placement can be critical. Masking is provided to cover either the source or drain side during implantation. To assure implantation on the unmasked side, the mask should be aligned over the gate 150. To accommodate for variances in gate length, the mask further should be offset so as to eliminate blockage caused by an "overhanging" mask. For best results, the masking layer 160 should be offset by a minimum of an overlay value (OL) from the edge 155 of the gate leaving a portion of the gate exposed, the OL value being predefined by manufacturing parameters, and is typically 0.15 microns from the gate edge for 0.35 micron gate technology. Occasionally however, when a smaller gate is produced due to manufacturing variances, the resist mask 160 may extend past the edge of gate 150 so that the mask will still extend past the gate, blocking the doping of the channel beneath the gate. (FIG. 7.)

Figure 8A:
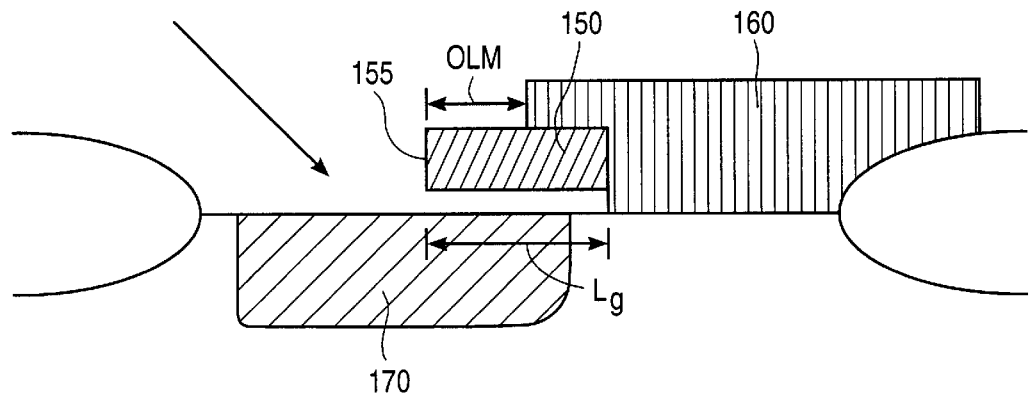
FIG. 8A is a cross-sectional view of alignment of the masking layer in accordance with the present invention.
Figure 8B:
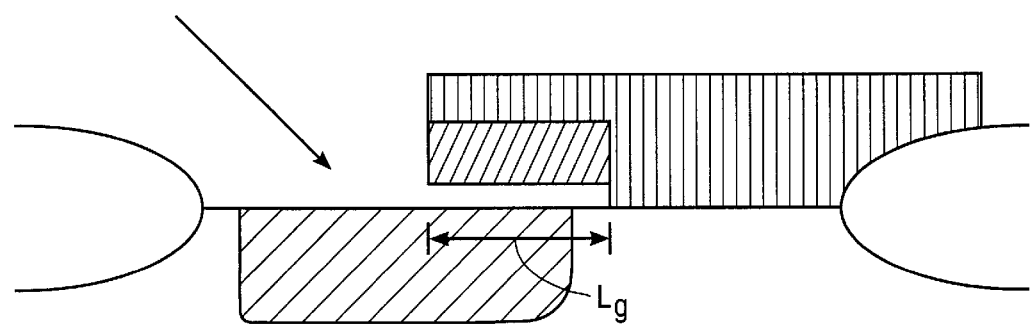
FIG. 8B is a cross-sectional view of mask placement misalignment to the left in accordance with the present invention.
Figure 8C:
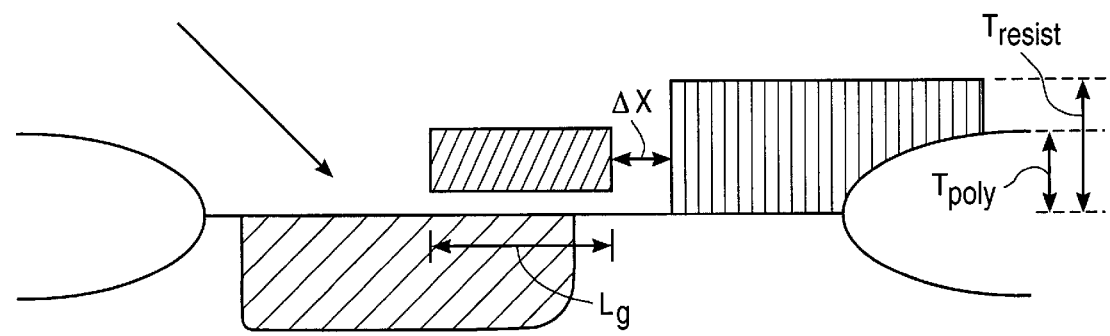
FIG. 8C is a cross-sectional view of mask placement misalignment to the right in accordance with the present invention.

By defining an offset value of maximum overlay (OLM) as the maximum of the OL value and ½ $L_g$, max(OL,$L_g$/2), mask placement can be significantly improved, eliminating manufacturing concerns. As shown in FIG. 8A, ideally shifting the resist mask 160 by maximum overlay will result in placement near the middle of the gate 150. However, as shown in FIGS. 8B and 8C, shifts resulting in placement of the resist mask 160 elsewhere will also work. For instance, if the resist mask is misaligned to the left, resulting in a total overlay of the gate 150, channel doping may still occur as shown in FIG. 8B. Misalignment of the gate to the right will result in a gorge, $\Delta x$, between the gate 150 and the resist mask 160, but will cause a shadowing effect, which effectively prevents doping near the drain region. $\Delta x$ is defined by the following equation:

$$\Delta x_{min} = (T_{resist} - \tfrac{1}{2} T_{poly}) \tan \theta_{min}.$$

This calculation applies for all gate lengths. Therefore, if the poly thickness is 2500 Å, resist thickness is 5000 Å, gate oxide thickness is 70 Å, and $\theta_{min}$ is 45°, then $\Delta x$ can be as much as 0.25 microns.

Further, although substrate 110 is rotated during implantation, the existence of $\Delta X$ will not effect the channel region. Because doping occurs at 90° intervals, only rotation of 0° and 180° will effect the channel region. Rotation of 90° and 270° will result in doping only in the $\Delta x$ region and not under the gate, thereby having no affect on the doping of the channel region. Subsequently, when the source and drain regions are formed, any region doped in the $\Delta x$ region will be encompassed in the LDD region 185 or drain region 195 if no LDD region is formed.

The invention has been described with respect to a particular embodiment thereof, and it will be understood that numerous modifications are possible within the scope of the invention as set forth in the claims.

What is claimed is:

1. A method of doping a semiconductor substrate, comprising the steps of:

forming a gate over said substrate, said gate having a first edge and said gate having a length;

forming a masking layer extending over a first part of said gate, said masking layer positioned a maximum overlay distance from said first edge of said gate such that a second part of said gate is exposed, wherein said maximum overlay distance is defined by max(OL, $L_g$/2), where OL is a predefined overlay value, and $L_g$ is said gate length, and where max(x,y) is a function defining the maximum value of x and y; and forming a variantly doped channel region under said gate.

2. The method of claim 1, wherein the step of forming a gate over said substrate includes:

forming a gate oxide layer over said substrate;

forming a polysilicon layer over said gate oxide layer; and removing portions of said polysilicon layer.

3. The method of claim 1 wherein said step of forming a variantly doped channel region includes implanting ions at an angle from a position perpendicular to said substrate after said step of forming said gate.

4. The method of claim 3 wherein said angle is approximately 45°–60° from perpendicular to said substrate.

5. The method of claim 3, wherein the step of implanting ions includes rotating said substrate in a plane.

6. The method of claim 1, wherein the step of forming a masking layer comprises the steps of:

forming a resist layer over said gate and said substrate;

removing a portion of said resist layer which does not overlie said second part of said gate.

7. The method of claim 1, wherein said predefined overlay value is approximately 0.15 microns.

8. A method of doping a semiconductor substrate, comprising the steps of:

growing a gate oxide layer over said substrate;

depositing a polysilicon layer over said gate oxide layer;

etching said polysilicon layer to form a polysilicon gate, having a gate length and having an edge;

applying a photoresist layer over said gate and said substrate;

aligning a mask over said photoresist layer having a pattern such that said pattern on said mask is offset from said edge by a maximum overlay distance defined by max(OL, $L_g$/2), where OL is a predefined overlay value and $L_g$/2 is half said gate length, and where max(x,y) is a function defining the maximum value of x and y;

exposing said mask and said photoresist layer to ultraviolet light;

removing a portion of said photoresist layer;

implanting ions into said substrate under said polysilicon gate at an angle of approximately 45°–60° from perpendicular to said substrate; and rotating said substrate in a plane.

9. The method of claim 8, wherein said predefined overlay value is approximately 0.15 microns.

10. A method of doping a substrate, comprising the steps of:

forming a polysilicon gate over said substrate, said polysilicon gate having a gate length and having an edge;

forming a resist layer over said gate and said substrate;

removing a first portion of said resist layer such that a second portion of said resist layer is over a first portion of said polysilicon gate, said second portion of said resist layer being positioned a maximum overlay distance from said edge of said polysilicon gate, said maximum overlay distance defined by max(OL, $L_g$/2), where OL is a predefined overlay value and ($L_g$/2) is half of said gate length, and where max(x,y) is a function defining the maximum value of x and y; and implanting ions into said substrate under said polysilicon gate.

11. The method of claim 10, wherein said predefined overlay value is approximately 0.15 microns.

12. The method of claim 10, wherein the step of implanting ions into said substrate under said polysilicon gate includes the step of implanting ions into said substrate under said gate at an angle to said substrate.

13. The method of claim 12, further comprising the step of rotating said substrate in a plane.

14. The method of claim 12, wherein said angle is approximately 45°–60° from perpendicular to said substrate.

* * * * *